(12) United States Patent
Mazzillo et al.

(10) Patent No.: US 12,009,439 B2
(45) Date of Patent: Jun. 11, 2024

(54) PHOTODIODE AND METHOD FOR OPERATING A PHOTODIODE

(71) Applicant: ams-OSRAM International GmbH, Regensburg (DE)

(72) Inventors: Massimo Cataldo Mazzillo, Hamburg (DE); Tim Boescke, Regensburg (DE)

(73) Assignee: ams-OSRAM International GmbH, Regensburg (DE)

( * ) Notice: Subject to any disclaimer, the term of this patent is extended or adjusted under 35 U.S.C. 154(b) by 42 days.

(21) Appl. No.: 17/996,914

(22) PCT Filed: Apr. 24, 2020

(86) PCT No.: PCT/EP2020/061512
§ 371 (c)(1),
(2) Date: Oct. 21, 2022

(87) PCT Pub. No.: WO2021/213674
PCT Pub. Date: Oct. 28, 2021

(65) Prior Publication Data
US 2023/0163223 A1    May 25, 2023

(51) Int. Cl.
*H01L 31/02*     (2006.01)
*H01L 31/0203*   (2014.01)

(52) U.S. Cl.
CPC .... *H01L 31/02019* (2013.01); *H01L 31/0203* (2013.01)

(58) Field of Classification Search
CPC ............. H01L 27/146; H01L 27/14643; H01L 31/02019; H01L 31/0203
See application file for complete search history.

(56) References Cited

U.S. PATENT DOCUMENTS

2012/0286144 A1*  11/2012  Holz .................. G01J 1/42
                                              257/439

FOREIGN PATENT DOCUMENTS

GB    2576607 A    2/2020

OTHER PUBLICATIONS

Abdo, N., et al., "Optical effect considerations for bulk to SOI retargeting of hybrid MOS-PN dynamic photo-sensor," in Computer Science, published in the 6th International Workshop 2015, DOI: 10.1109/IWASI.2015.7184966, Jun. 18-19, 2015, 5 pages.

(Continued)

*Primary Examiner* — Kevin K Pyo
(74) *Attorney, Agent, or Firm* — Slater Matsil, LLP

(57) ABSTRACT

In an embodiment a photodiode includes a semiconductor body having a light entrance side and a back side opposite the light entrance side, a first electrode at the light entrance side atop a first doped area of a first conductivity type, a second electrode at the light entrance side atop a second doped area of a second conductivity type, the second doped area being configured to absorb radiation, a gate region at the light entrance side at least between the first electrode and the second electrode, the gate region being connected to a gate electrode, a base electrode at the semiconductor body, the base electrode being configured to receive a current flow from the first electrode, the current flow being indicative of a radiant flux of the radiation onto the second doped area and a radiation shield covering and shielding the first doped area from the radiation to be detected.

18 Claims, 7 Drawing Sheets

(56) References Cited

OTHER PUBLICATIONS

Okhonin, S., et al., "A dynamic operation of a PIN photodiode," in Applied Physics Letters 106, 031115 (2015), doi: 10.1063/1.4906488, Jan. 22, 2015, 6 pages.

Sallin D., et al., "Optimized operation and temperature dependence of a direct Light-to-Time converter," 2015 IEEE 13th International New Circuits and Systems Conference (NEWCAS), Jun. 7-10, 2015, 4 pages.

Sallin, D. et al., "Toward direct light-to-digital conversion using a pulse-driven hybrid MOS-PN photodetector," Optics Letters, vol. 40, No. 4, Feb. 15, 2015, pp. 669-672.

\* cited by examiner

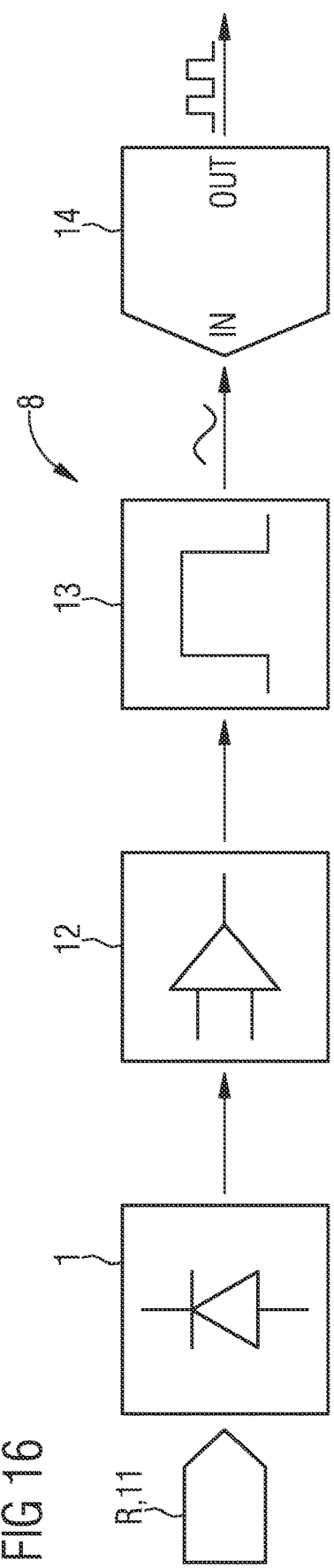
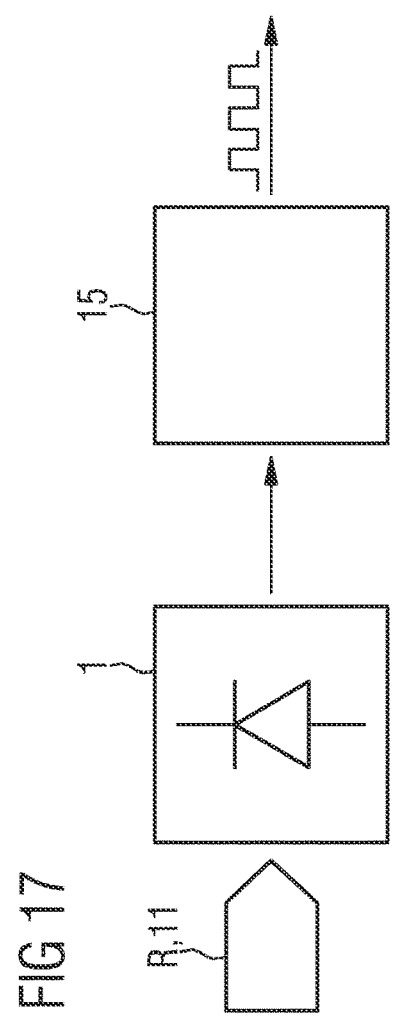

PHOTODIODE AND METHOD FOR OPERATING A PHOTODIODE

This patent application is a national phase filing under section 371 of PCT/EP2020/061512, filed Apr. 24, 2020, which is incorporated herein by reference in its entirety.

TECHNICAL FIELD

A photodiode is provided. Further, a method for operating a photodiode is also provided.

BACKGROUND

Document S. Okhonin et al., "A dynamic operation of a PIN photodiode" in Applied Physics Letters 106, 031115 (2015), doi: 10.1063/1.4906488, and document N. Abdo et al., "Optical effect considerations for bulk to SOI retargeting of hybrid MOS-PN dynamic photo-sensor" in Computer Science, published in the 6th International Workshop 2015, DOI: 10.1109/IWASI.2015.7184966, refer to dynamic photodiodes.

SUMMARY

Embodiments provide a photodiode that can be operated efficiently with a high signal-to-noise ratio and which is highly sensitive.

Embodiments provide a highly sensitive photodiode in particular for low power consumption applications.

According to at least one embodiment, the photodiode comprises a semiconductor body. The semiconductor body is, for example, partially or completely epitaxially grown. In particular, the semiconductor body is based on silicon. However, other semiconductor materials like germanium or compound semiconductor materials like gallium arsenide or gallium phosphide may also be used for the semiconductor body, as well as silicon carbide and indium aluminum gallium nitride or indium gallium nitride.

According to at least one embodiment, the semiconductor body comprises a light entrance side. The light entrance side is configured to allow to-be-detected radiation to enter the semiconductor body with a high efficiency. For example, the light entrance side may be provided with an anti-reflection layer. Opposite the light entrance side, there is a back side of the semiconductor body. The back side may be applied to a carrier of the semiconductor body like a growth substrate or a substitute carrier replacing a growth substrate.

According to at least one embodiment, the photodiode comprises a first electrode. The first electrode is located at the light entrance side. For example, the first electrode is configured as an anode.

According to at least one embodiment, the first electrode is located atop a first doped area of a first conductivity type. The first conductivity type is, for example, p-type conductivity. This means that the first doped area can be a p-doped area, in particular a heavily p-doped area.

According to at least on embodiment, the photodiode comprises at least one second electrode. The second electrode or the second electrodes is/are located at the light entrance side.

According to at least one embodiment, there is one second doped area per second electrode. The at least one second doped area is of a second conductivity type different from the first conductivity type. The second conductivity type is in particular n-type conductivity. This means that the at least one second doped area can be heavily n-doped.

According to at least one embodiment, the second doped area is configured to absorb radiation to be detected. This radiation absorption results in the photogeneration of charge carriers. In order to enhance absorption and/or photogeneration, the second doped area can be specifically doped to increase absorption and/or photogeneration of charge carriers in the desired spectral range.

According to at least one embodiment, the photodiode includes a gate region. The gate region is located at the light entrance side. In particular, the gate region is located at least in part between the first electrode and the second electrode. The gate region is electrically connected to a gate electrode.

According to at least one embodiment, the photodiode comprises a base electrode. The base electrode is located at the semiconductor body and/or is electrically connected to the semiconductor body. The base electrode is configured to receive a current flow in particular from the first electrode, the current flow being indicative of a radiant flux of the radiation onto the second doped area. The base electrode can be located at the light entrance side or also at the back side.

According to at least one embodiment, the photodiode includes a radiation shield, also referred to as a shielding layer. The radiation shield covers and shields the first doped area from the radiation to be detected. Thus, because of the radiation shield no or no significant portion of the radiation to be detected can reach the first doped area. However, the radiation shield preferably does not penetrate the semiconductor body and the radiation shield is preferably applied exclusively at a distance from and/or outside the semiconductor body.

In at least one embodiment, the photodiode comprises a semiconductor body having a light entrance side and a back side opposite the light entrance side. A first electrode is located at the light entrance side atop a first doped area of a first conductivity type. A second electrode is located at the light entrance side atop a second doped area of a different, second conductivity type. The second doped area is configured to absorb radiation to be detected and therefore to generate charge carriers. A gate region is located at the light entrance side at least between the first electrode and the second electrode, the gate region being connected to a gate electrode. Further, there is a base electrode at the semiconductor body, the base electrode being configured to receive a current flow from the first electrode, the current flow being indicative of a radiant flux of the radiation onto the second doped area. Further, there is a radiation shield covering and shielding the first doped area from the radiation to be detected.

There are several applications, mainly in the consumer area, requiring the use of optical sensors operating simultaneously with high signal-to-noise ratio, SNR for short, that is with high gain, high photodetection efficiency and low dark current. For such sensors, low power consumption is often required. For example, time-of-flight sensors, abbreviated as ToF sensors, or sensors for optical proximity measurements in smartphones and photoplethysmography, abbreviated as PPG, devices for vital signs monitoring in wearable and hearable devices would strongly benefit from the use of detectors operating with high efficiency, amplified signal and low power.

Thus, a photodiode design is provided herein with an optional integrated amplification structure to meet the requirements described above.

The only integrated devices commercially available at present that are able to provide an intrinsic high amplification response with good SNR characteristics are so-called single photon avalanche diodes, abbreviated as SPADs.

However, SPADs operate at high reverse bias, which is at a voltage of at least 15 V to 20 V, and thus do not meet the low power consumption requirements needed for consumer applications.

Moreover, the concept of a technology called dynamic photodiode, abbreviated as DPD, has recently been suggested. Such DPDs operate at high gain and limited power consumption. However, this technology shows several limitations in terms of low quantum efficiency and thus low SNR, negatively affecting their performances in application, in particular compared to standard signals readout electronics like the PIN photodiode combined with an analog-to-digital converter. Moreover, in this technology the amplification region is coincident with the absorption region, which gives rise to a limited performance in infrared detection and which may lead to additional noise, due to the direct absorption of photons in a metal oxide semiconductor inverted region of a field effect transistor, including in an area of an electron channel.

Finally, the electrical field partially responsible for collection of photocarriers in the photodiode bulk material is extremely weak, and a diffusion current is comparable to a drift current. This produces an increase in dark current, responsible for linearity and SNR limitations at low photon fluxes.

Here, two photodiode embodiments are presented, with an internal multiplication mechanism and without an internal multiplication mechanism. The embodiments are preferably compatible with CMOS technology, but the embodiments can alternatively also be compatible with other technologies. These embodiments are characterized in particular by the following features:

decoupled absorption and amplification regions are located in different areas of the photodiode;

the amplification region is shielded from light absorption thanks to the use of in particular a metal shielding layer covering the same;

photodiodes sharing the same amplification region but each characterized by different absorption properties can be integrated in the same structure, allowing the possibility of integrating a multichannel photodiode structure in the same device. This means that, for example, because of the use of suitable optical filters or different depleted region characteristics, there can be a sensitivity in particular of the RGB type, that is of the red, green, blue sensitivity type. This is not possible in current DPD implementation designs or standard SPAD structures. Thus, the photodiode presented herein provides a couple of advantages over DPD and SPAD designs;

the absorption region is fully decoupled from the amplification region, allowing the minimization of noise sources induced, for example, by photon generation in the channel area, and thus allows the absorption efficiency to be increased at the same time. In particular, there is no restriction to the limited size of amplification regions governed by the pinch-off effect;

the increase in the absorption and collection efficiency leads to a general increase in quantum efficiency. This means that a minimization of a dark current and thus a better SNR can be achieved in a wide range of experimental conditions;

the absorption characteristics of the photodiode can be suitably tailored and/or modulated, for example, to enhance the collection efficiency in specific spectral regions or to modify the sensitivity to have a particular spectral shape, according to the requirements of the actual application. This can be done, for example, by modulating the depletion layer thickness or by using suitable optical filters on the surface of the device in the absorption areas and/or by using different optically active regions;

multiple photodiodes with different spectral characteristics can be integrated in a single device, that is in different areas of the same semiconductor chip, sharing the same amplification region. This can be achieved, for example, by implementing a multiplexed readout scheme for all the integrated detection channels.

According to at least one embodiment, the photodiode is configured to: upon applying a reverse bias voltage between the first electrode and the second electrode and upon applying a gate voltage to the gate electrode, let generated charge carriers from the second doped area balance a depletion at the first doped area so as to enable the current flow between the base electrode and the first electrode. This means that, by means of the photogenerated charge carriers, the current flow is enabled in particular between the first electrode and the base electrode.

According to at least one embodiment, the radiation shield completely covers the first doped area and/or the gate region. Preferably, the second doped area is distant from the radiation shield. These aspects can be seen in particular in a top view onto the light entrance side.

According to at least one embodiment, the radiation shield is electrically insulated at least from the first electrode, the second electrode and the gate electrode. This means that there is no direct electrical connection between the radiation shield and the first electrode, the second electrode and the gate electrode.

According to at least one embodiment, the radiation shield is of an electrically conductive material. For example, the radiation shield is of at least one metal. In particular, the radiation shield is of aluminum or silver or of an aluminum or silver alloy. It is likewise possible for the radiation shield to be of an absorbing design to avoid light reflections at the radiation shield. For example, the radiation shield can include a layer of an absorbing material like carbon black.

According to at least one embodiment, the radiation shield is located near the semiconductor body. For example, a maximum distance between the radiation shield and the light entrance side is at most 10 μm or 4 μm or 1 μm. Thus, the first doped area can efficiently be shielded from scattered light.

According to at least one embodiment, the radiation shield is of an electrically insulating material. In this case, the radiation shield may be of a matrix material that includes particles of an absorbing or reflective material. In this case, the radiation shield may touch the semiconductor body.

According to at least one embodiment, the radiation shield is electrically insulated from the semiconductor body and is not electrically functionalized in the photodiode. This applies in particular when the radiation shield is made of at least one metal.

According to at least one embodiment, the photodiode further comprises a substrate. The substrate can be a growth substrate for the semiconductor body. Otherwise, the substrate is a substitute carrier that replaces a growth substrate of the semiconductor body. Further, it is possible that the substrate is part of the semiconductor body.

According to at least one embodiment, the substrate is of the first conductivity type. In particular, the substrate is heavily p-doped.

According to at least one embodiment, the semiconductor body as a whole is doped, in particular weakly doped.

Preferably, the doping of the semiconductor body is of the first conductivity type. Hence, the semiconductor body can be weakly p-doped.

According to at least one embodiment, the base electrode is located at the back side of the semiconductor body. In particular, the base electrode can be realized by the heavily doped substrate.

According to at least one embodiment, the base electrode is located at the light entrance side of the semiconductor body. In this case, for example, there is a further doped area at the light entrance side that is associated with the base electrode. In this case, electrically insulating substrates may be used.

Preferably, the substrate is a silicon substrate, but other substrates of, for example, semiconductor materials like Ge or GaAs may be used, too.

According to at least one embodiment, the gate region completely surrounds the first electrode, seen in a top view onto the light entrance side. Thus, the gate region can form a frame around the first electrode. Otherwise, the first electrode can be surrounded by the gate electrode on, for example, only two or three sides. This applies in particular when the first electrode is located at an edge or in a corner region of the light entrance side, seen in a top view.

According to at least one embodiment, the photodiode further comprises at least one third electrode. The third electrode is located atop a third doped area. The third doped area is preferably of the second conductivity type. This means that it can be of a heavily doped n-type. If there is a plurality of third electrodes, preferably there is a one-to-one matching of the third electrodes and the third doped areas.

According to at least one embodiment, the first electrode is located between the second electrode and the third electrode. This applies in particular in a top view onto the light entrance side. Preferably, seen in a top view, there is no direct line of connection between the third electrode and the second electrode that does not run through the first electrode.

According to at least one embodiment, a junction between the first electrode and the third electrode is configured to be forward biased. That is, in intended operation of the photodiode there is a forward bias between the first electrode and the third electrode.

According to at least one embodiment, the third electrode is configured for a signal amplification of the current flow between the base electrode and the first electrode. This means that, by means of the third electrode, amplification of the current flow can be achieved.

According to at least one embodiment, the third electrode as well as all areas between the third electrode and the first electrode are completely covered by the radiation shield. Hence, no or virtually no radiation can reach the first doped area and the third doped area or any area of the semiconductor body located between the first and third doped areas.

According to at least one embodiment, the photodiode comprises a plurality of the second electrodes. Preferably, there is a one-to-one assignment between the second electrodes and the associated second doped areas. This means that every second electrode can have its own exclusive second doped area.

According to at least one embodiment, the second electrodes and the associated second doped areas are sensitive for different spectral regions of the radiation to be detected. For example, there is one second doped area sensitive for blue light, one second doped area sensitive for green light, one second doped area sensitive for red light, one second doped area sensitive for ultraviolet radiation and/or one second doped area sensitive for near infrared radiation. Hence, the photodiode can be sensitive in different spectral regions.

According to at least one embodiment, the second electrodes and, thus, the associated second doped areas are individually addressable. This is in particular enabled by applying voltages to the second electrodes independently of each other.

According to at least one embodiment, the number of the second electrodes is at least two or three or four. As an alternative or in addition, the number of second electrodes is at most 25 or 16 or 12 or 6. Thus, there is a comparably small number of second electrodes.

According to at least one embodiment, all the second electrodes are assigned to the same first electrode. Thus, there is a plurality of second electrodes but there is only one first electrode. Optionally, there is just one third electrode for all the second electrodes.

According to at least one embodiment, the first electrode is a line segment. This means that the first electrode runs in the form of a straight line segment seen in a top view onto the light entrance side. Otherwise, seen in a top view, the first electrode can have a curvature, for example, a semi-circle or also a circle. Other forms for the first electrode like L shapes or triangular or quadrangular shapes are also possible, seen in a top view.

According to at least one embodiment, the second electrodes are arranged along the first electrode when seen in a top view onto the light entrance side. In particular, a distance of the electrodes from the first electrode is the same for all the second electrodes. Thus, an arrangement of the second electrodes can correspond to the shape of the first electrode.

According to at least one embodiment, the photodiode receives an optical input and is configured to convert the optical input into an electrical signal that is fed to at least one of a transimpedance amplifier, a filter and an analog-to-digital converter, preferably in the stated sequence. In particular, the analog-to-digital converter is configured to output a digitalized signal representative for the optical input.

According to at least one embodiment, the photodiode receives an optical input and is configured to convert the optical input into an electrical signal that is fed directly or indirectly to a time-to digital converter that is configured to output a digitalized signal representative for the optical input.

The photodiode, the optional transimpedance amplifier, the optional filter and the analog-to-digital converter and alternatively the time-to digital converter can be integrated in a specific component, like the sensor. Otherwise, the photodiode and the transimpedance amplifier, the filter and/or the analog-to-digital converter or alternatively the time-to digital converter could be distinct components.

Moreover, a method for operating a photodiode is provided. The method is in particular intended for a photodiode as described in connection with one or more of the exemplary embodiments explained above. Therefore, features for the method are also disclosed for the photodiode and vice versa.

In at least one embodiment, the photodiode is operated as follows:
- a reverse bias voltage is applied between the first electrode and the second electrode,
- a gate voltage is applied to the gate electrode,
- the photogenerated charge carriers from the second doped area balance a depletion at the first doped area,
- a current flow between the base electrode and the first electrode is enabled by balancing the depletion, and information on a radiant flux of the radiation to be detected and absorbed in the second doped area is provided by the current flow out of the first doped area, towards the base electrode and/or towards the third electrode.

According to at least one embodiment, in particular in which the photodiode is without any third electrode, the current flow is used as it is as a measurement signal for the radiant flux. Thus, the current flow is not amplified. That the current flow is used as a measurement signal means, for example, that the current flow is guided through an electrical resistance and a voltage drop across said resistance is measured.

According to at least one embodiment, in particular in which the photodiode comprises the at least one third electrode, the current flow is amplified by means of the third electrode. A measurement signal for the radiant flux is in particular the time delay between a reset of the photodiode and a beginning of the amplified current flow. This means that the current flow is not directly measured but is used to indicate the time delay. Hence, the time delay is used to determine the radiant flux of the radiation to be detected.

BRIEF DESCRIPTION OF THE DRAWINGS

Advantageous embodiments and developments of the photodiode and the method will become apparent from the exemplary embodiments described below in association with the figures. In the exemplary embodiments and figures, similar or similarly acting constitute parts are provided with the same reference signs. The elements illustrated in the figures and their size relationships among one another should not be regarded as true to scale unless indicated otherwise. Rather, individual elements may be represented with an exaggerated size for the sake of better representability and/or for the sake of better understanding.

In the figures:

FIGS. 16 and 17 show schematic electrifications of exemplary embodiments of photodiodes described herein.

DETAILED DESCRIPTION OF ILLUSTRATIVE EMBODIMENTS

Figure 1:
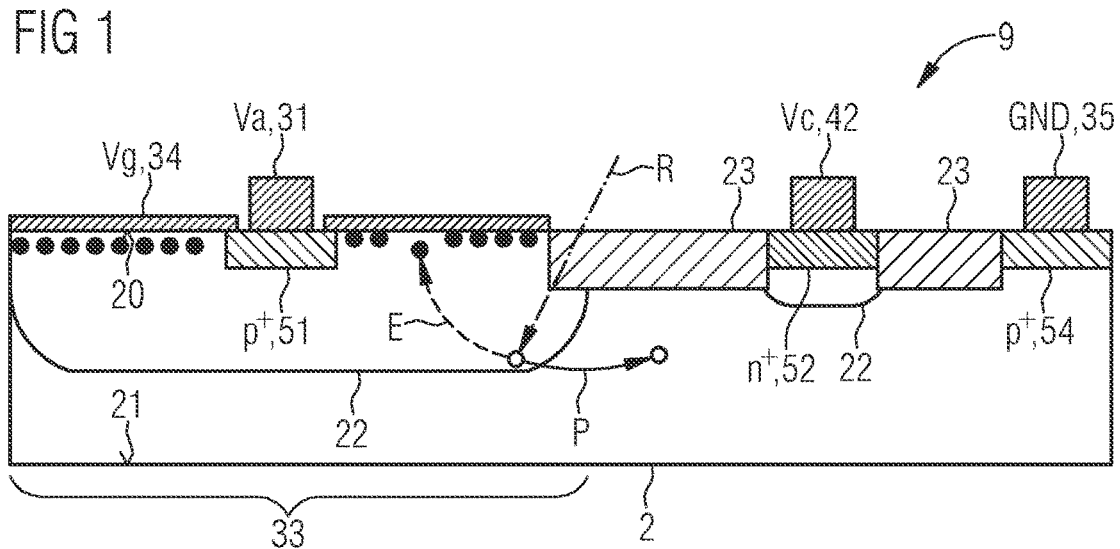
FIGS. 1 and 2 show cross-sectional views of a modification of a photodiode and a method to operate such a modification.
Figure 2:
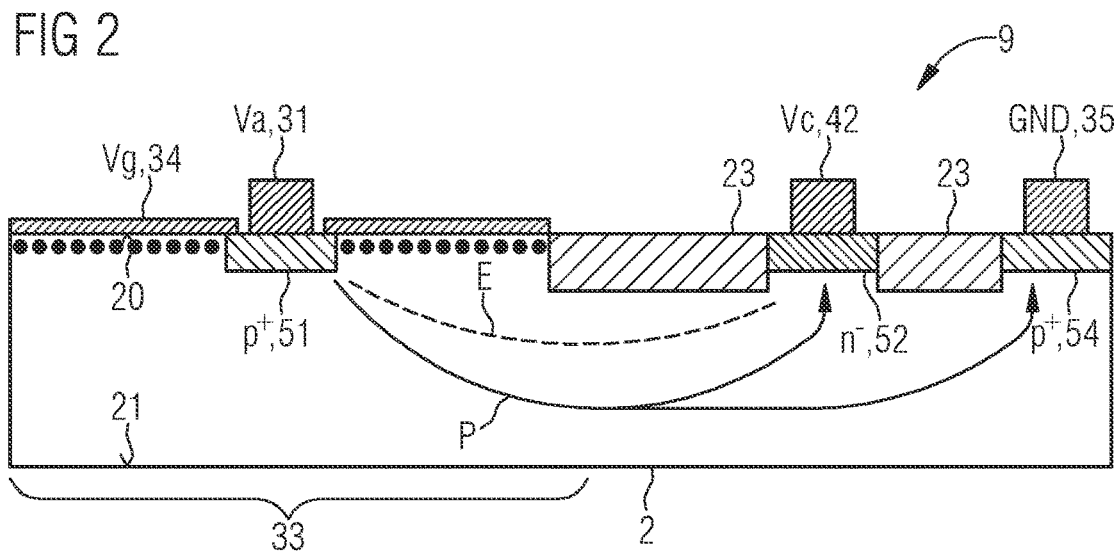
Figure 3:
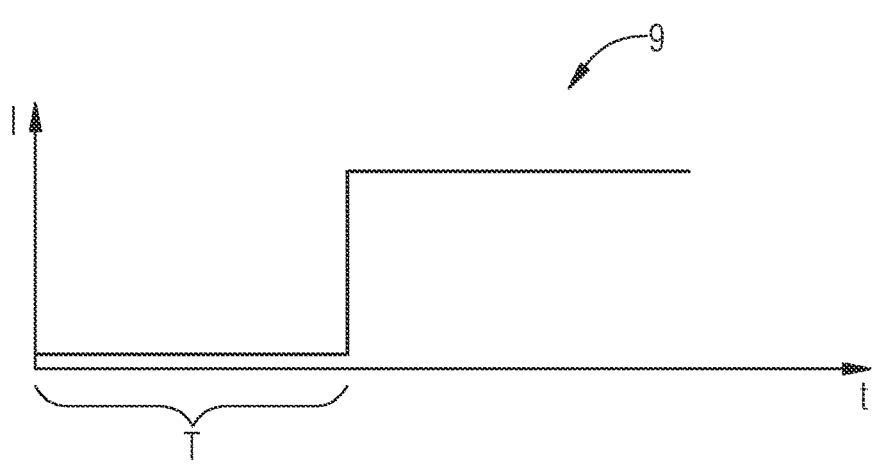
FIG. 3 shows a measurement scheme of the modification of FIGS. 1 and 2.

S. Okhonin et al., "A dynamic operation of a PIN photodiode" in Applied Physics Letters 106, 031115 (2015), doi: 10.1063/1.4906488, have recently proposed a new device based on a dynamic operation mode called Dynamic PhotoDiode, DPD for short, potentially able to operate with signal amplification and very low power consumption without operating in avalanche breakdown conditions. Such a modification 9 and its mode of operation are illustrated in FIGS. 1 to 3.

The modification 9 comprises a semiconductor body 2 having a gate region 33. In the gate region 33, there is a first doped area 51 below a first electrode 31. The first electrode 31 is surrounded by a gate electrode 34. Voltages Va, Vg are applied to these electrodes 31, 34. Further, there is a second doped area 52 below a second electrode 42, and a further doped area 54 below a base electrode 35. Voltages Vc, GND are applied to the electrodes 42, 35, respectively. The doping of the areas 51, 52, 54 is indicated in FIGS. 1 and 2. Moreover, around the areas 51, 52, there are depleted regions 22 in the stationary case.

Thus, the detector 9 is based on a MOS-PN hybrid concept, providing as a measurable signal a time delay T called triggering time occurring between the instant when the device is re-armed for photon detection after quenching and the instant when an amplified current flows in the device. This time turns out to be proportional to the intensity of impinging radiation R. The timing signal is then suitably digitized by a Time to Digital Converter, TDC for short, connected to the detector. This means that the DPD 9 triggers when N electrons E are accumulated.

The application of a high gate bias on the low doped semiconductor body 2 by means of the base electrode 35 puts the MOS structure in an inversion condition, by creating an electron channel below the gate electrode 34 and all around large depleted regions 22 formed by negatively ionized fixed charge in the substrate. Said depleted region 22 around the anode 31, 51 pinches the anode terminal according to the JFET effect, hindering a current flow of holes P from the anode 31 to the cathode 42 and electrons E from the cathode 42 to the anode 31, corresponding to a forward current.

The absorption of photons of the radiation R in the depleted region 22 around the anode 31, 51 creates photoelectrons which drift towards the channel below the gate electrode 34. Keeping the negative charge density constant in the inverted region, this reduces the thickness of the depleted region 22. When finally a sufficient amount of charge is collected below the gate electrode 34, corresponding to a trigger condition, a thickness of the depleted region 22 becomes so small that it is no longer able to screen the forward current flow anymore.

The detection of the photons is then marked by a steep onset of the forward current, see FIG. 3, which guarantees a fast detection time and an amplified signal at very low terminal bias values, that is, at low power consumption. The time needed for the triggering charge to accumulate turns out to be proportional, but not strictly linearly, to the amount of the impinging radiation R. An average triggering time increases with the irradiance for low intensity values while saturates at high intensities due to the limited TDC resolution.

Whenever the use of a higher doping of the semiconductor body 2 does not allow to perfectly pinch the anode 31, a leakage current between the positively biased anode 31 and the semiconductor body 2 put at ground GND generates a small electrical field in the device 9, helping the electrons E photogenerated in the bulk to move towards the anode 31, in this way reducing the thickness of the depleted region 22 and allowing the forward current to flow between the anode 31 and the cathode 42.

This means that the modification 9 is a 4-terminal device. In a detection mode, typically the following applies: anode voltage Va=1 V, cathode voltage Vc=0.4 V, gate voltage Vg>1.8 V, voltage at the semiconductor body Vs, GND=0 V. Thus, the anode 31/cathode 42 junction is forward biased, and a gate bias sets the region of the semiconductor body 2 around the anode 31, 51 in deep depletion.

However, the DPD device 9 shows low quantum efficiency, especially in the near infrared spectral range, due to the limited area of the depleted/active region which is typically only a few μm thick and at most 10 to 20 μm wide to make possible the pinch-off effect around the anode 31, and in general there is an inefficient photo carrier collection mechanism. This reduces the signal-to-noise ratio, SNR for short, of the measurements done with the DPD modification 9 in a wide range of illumination conditions.

Further, the amplification and absorption regions are not decoupled, being coincident with the depleted region 22 created by the gate bias around the anode 31. This limits the area of the absorption region and, thus, the quantum efficiency, QE for short, especially in the near infrared spectral range, and adds additional noise sources on the measurements, like flicker noise, making the detector's behavior unstable.

Moreover, the electrical field partially responsible for photo carrier collection in the photodiode's bulk is extremely weak, and a diffusion current is comparable to the drift current. This results in an increase in dark current, responsible for linearity and SNR limitations at low photon fluxes.

These limitations of the DPD modification 9 of FIGS. 1 and 2 are addressed by the photodiode 1 described herein.

Figure 4:
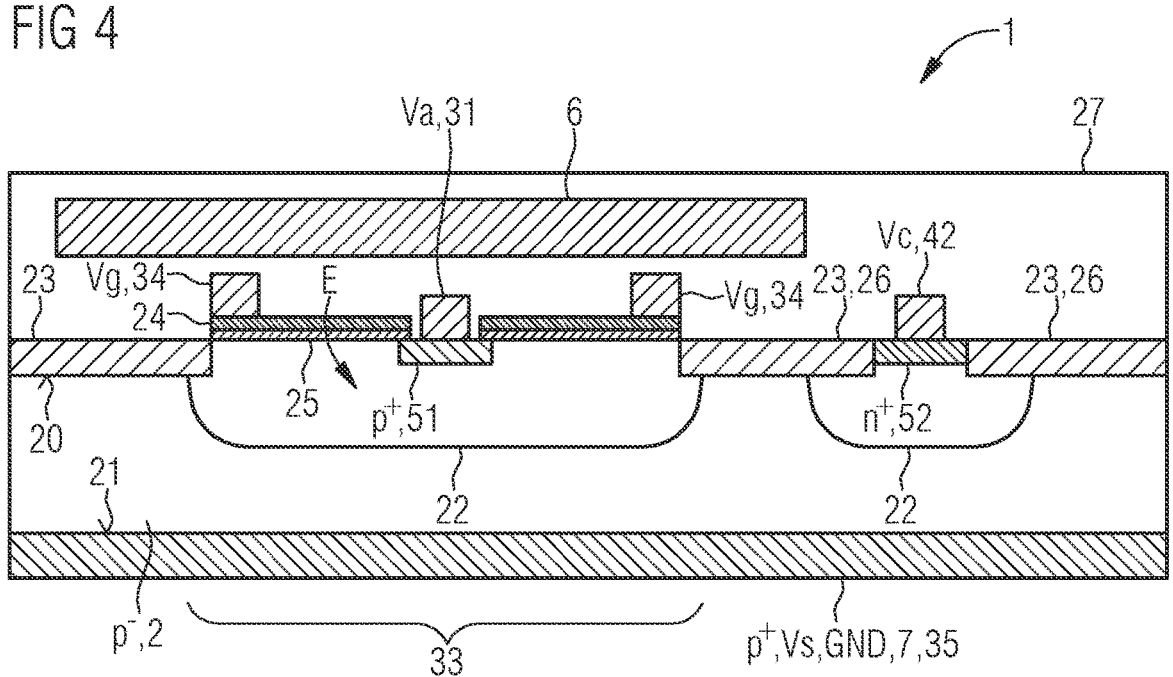
FIGS. 4 to 6 show sectional views of an exemplary embodiment of a photodiode and refer to an operation method of said photodiode.
Figure 5:
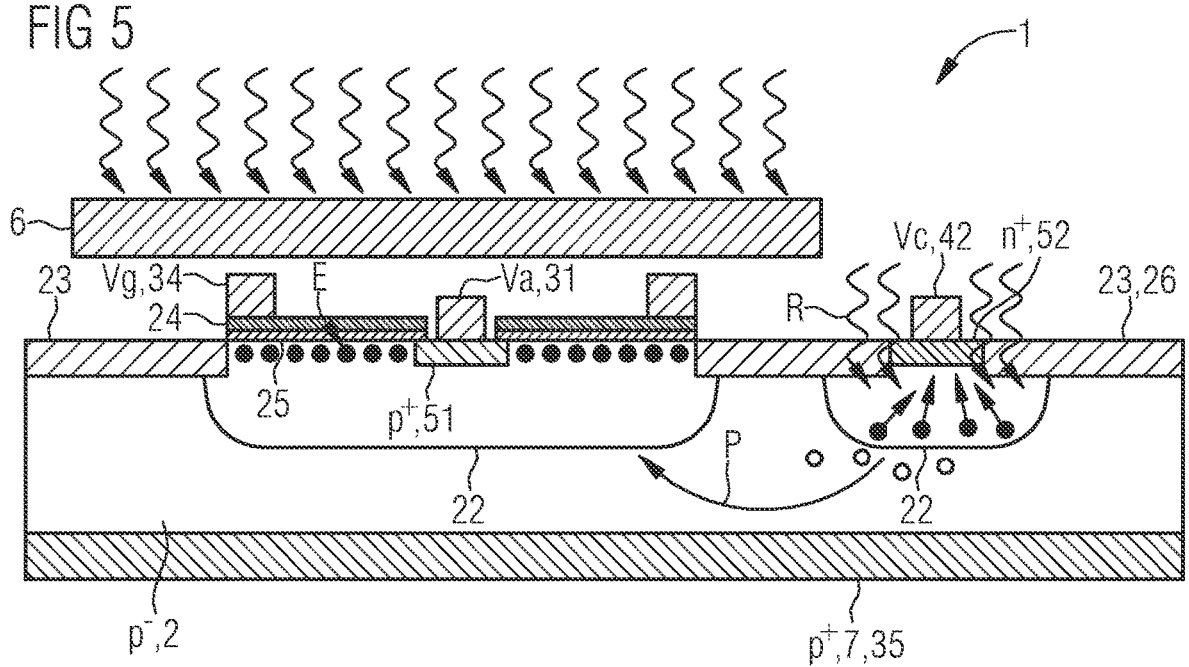
Figure 6:
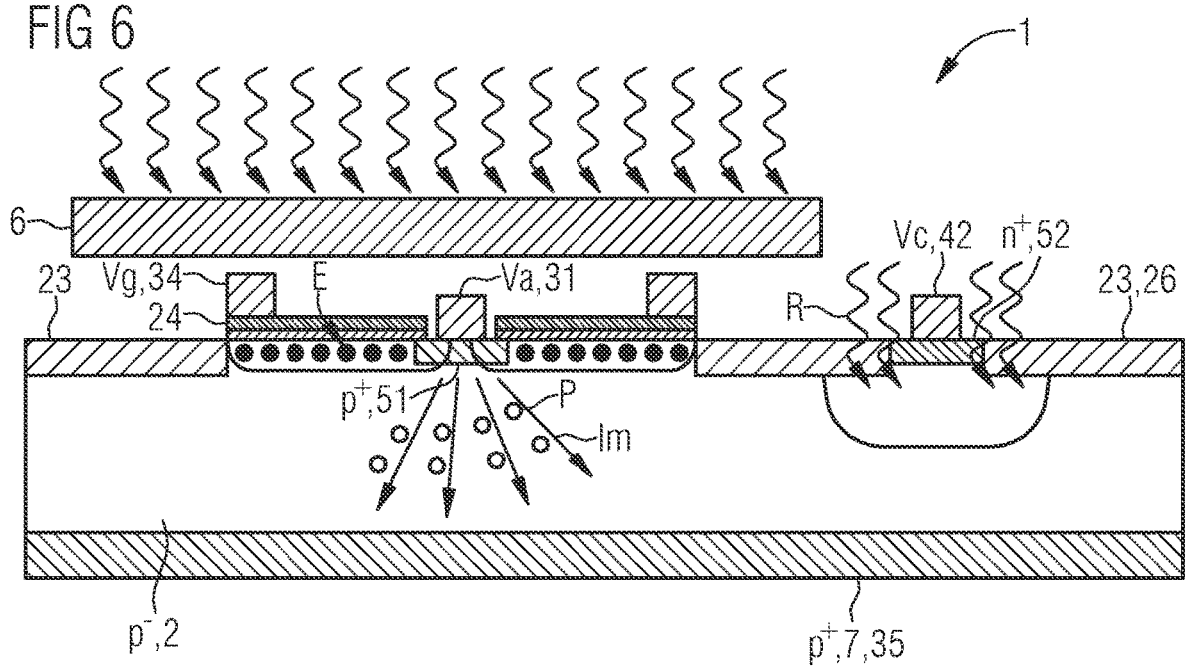

The exemplary embodiment of the photodiode 1 as shown in FIGS. 4 to 6 comprises a substrate 7 which is preferably highly p doped. The substrate can be a silicon carrier. The semiconductor body 2 is preferably weakly p doped and can be grown on the substrate 7. Thus, a back side of the semiconductor body 2 faces the substrate 7, and a light entrance side 20 is remote from the substrate 7.

The gate region 33 comprises a gate oxide 25, a conductive layer 24 like poly-silicon, and the gate electrode 34. The first electrode 31, which is preferably an anode, is located atop the first doped area 51, which is preferably highly p doped. Thus, in the stationary case in the gate region 33 there is the depleted region 22 around the first doped area 51.

The second electrode 42 is preferably a cathode so that the second doped area 52 is preferably highly n doped, resulting in a further depleted region 22. In addition, there are shallow trench insulations 23, STIs for short. Around the second electrode 42, the shallow trench insulation 23 can be combined with or replaced by an antireflection layer 26, for example, made of Si3N4, which can also serve as a passivation layer. The antireflection layer 26 can instead be applied on a deposited oxide 27.

According to FIG. 4, the base electrode 35 is realised by the substrate 7. Like in FIG. 1, instead the weakly doped and epitaxially grown semiconductor body 2 can be contacted by highly doped p wells on the device's 1 surface, instead of from the substrate 7.

The gate region 33, but not the region around the second electrode 42, is covered by a radiation shield 6, for example, made of a metal. Optionally, the whole light entrance side 20 is covered by the deposited oxide 27, wherein the radiation shield 6 can be embedded in the deposited oxide 27. For simplification of the drawings, the deposited oxide 27 is not shown in the other figures, but is preferably also present there.

Typical parameters for the photodiode 1 are as follows; these values can apply to all exemplary embodiments, in particular with a tolerance of not more than a factor of 2 or with a tolerance of not more than a factor of 1.5:

Substrate 7: 170 μm thick, doping 6×1019 cm−3;
grown semiconductor body 2: 10 μm thick, doping preferably 1×1013 cm−3 to 5×1013 cm−3;
first p doped area 51: 0.2 μm thick, doping 6×1019 cm−3;
second n doped area 52: 0.2 μm thick, doping 6×1019 cm−3;
poly-silicon layer 24: 0.2 μm thick, doping 1×1020 cm−3;
gate oxide 25: 5 to 10 nm thick;
shallow trench insulation 23: 0.3 μm thick;
deposited oxide 27: 5 to 6 μm thick; and
shielding metal, preferably aluminum: 1 μm thick.

Thus, the photodiode 1 of FIGS. 4 to 6 is a 4-terminal device, and in the detection mode preferably the following applies, in particular with a tolerance of not more than a factor of 2 or with a tolerance of not more than a factor of 1.5:

Voltage Va at the first electrode 31 as the anode: 1 V;
voltage Vc at the second electrode 42 as the cathode: >Va;
voltage Vg at the gate electrode 34: >1.8 V;
voltage Vs, GND at the substrate 7: 0 V.

This means that the anode 31/cathode 42 junction is reverse biased, and the gate bias introduces the deep depletion in the semiconductor body 2 region around the first doped area 51.

The photodiode 1 of FIGS. 4 to 7 works as follows:

The radiation R is absorbed only in the depleted region 22 around the cathode 42, 52, that is, at the n+/p− epi junction, while the metal shielding layer 6 hinders the direct absorption of photons in the pinched region around the p+ anode 31, 51. The photogenerated electrons E are collected at the n+ cathode 42, 52 while the photogenerated holes P drift towards the negatively charged depleted region 22 around the p+ anode 31, 51. This current of photogenerated holes P balances the fixed negative charge in the depleted region 22 around the p+ anode 31, 51.

After reaching a threshold value, according to a trigger condition, depending on the gate bias and the substrate doping, the thickness of the depleted region 22 around the p+ anode 31, 51 will be continuously reduced due to the flow of holes P, until the pinch-off between contiguous depleted regions 22 around the p+ anode 31, 51 will disappear. A hole current Im can thus flow between the anode 31, 51 and the substrate 7.

Figure 7:
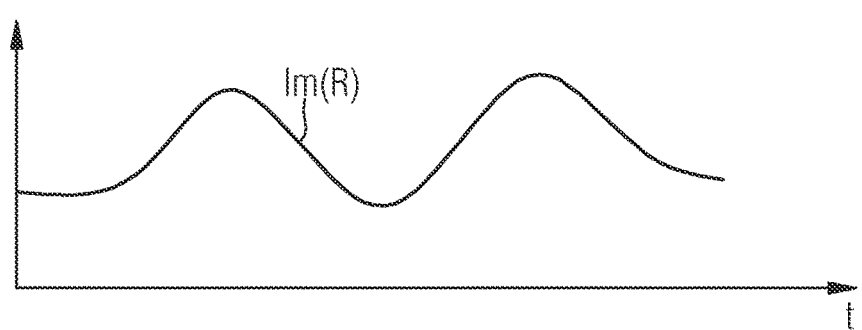
FIG. 7 shows a schematic measurement scheme of the photodiode of FIGS. 4 to 6.
Figure 8:
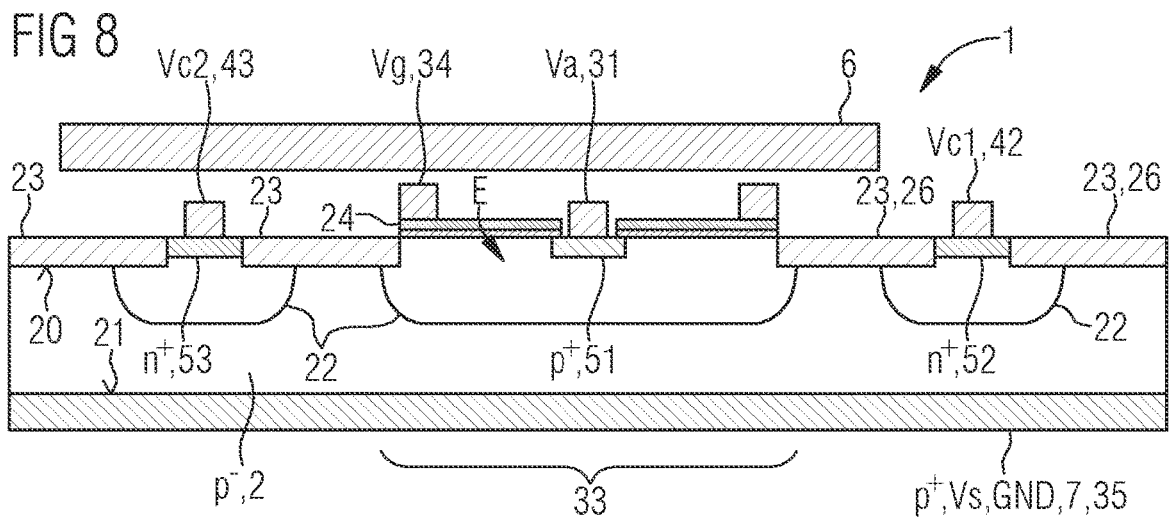
FIGS. 8 to 10 show sectional views of a further exemplary embodiment of a photodiode described herein and refer to a further operation method for said photodiode.
Figure 9:
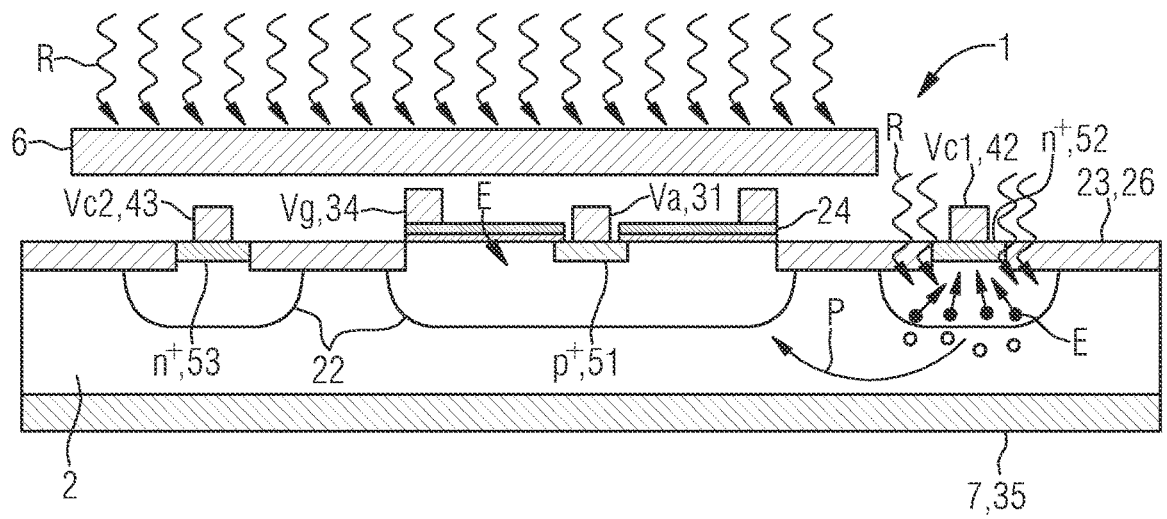
Figure 10:
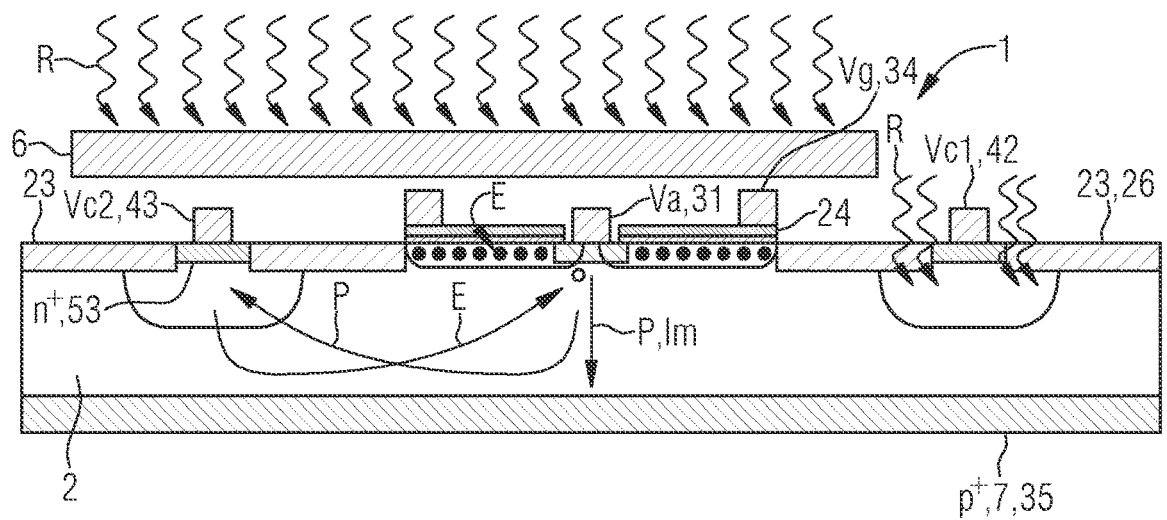
Figure 11:
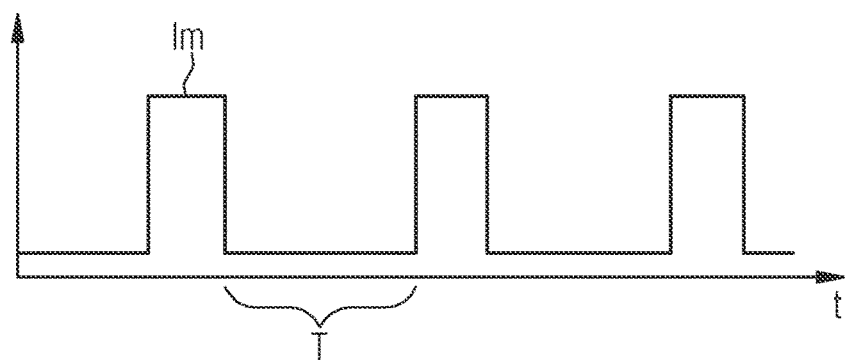
FIG. 11 illustrates a schematic measurement scheme of the photodiode of FIGS. 8 to 10.

The intensity of the current Im depends on the channel width between contiguous depleted regions 22 around the p+ anode 31, 51, being in this way proportional to the amount of photogenerated holes P and thus to the impinging photon flux, compare FIG. 7. The current signal Im can thus be converted in a voltage signal due to the resistance of the bulk epitaxial layer 2 and limited transverse dimension of the channel traversed by the current flow Im between the anode 31, 51 and the substrate 7, for example, by means of an integrated transimpedance amplifier.

In this configuration, the anode/substrate current flow Im, that is, the detection signal, is not amplified by internal multiplication mechanisms.

In summary, both the DPD modification 9 of FIGS. 1 to 3 and the photodiode 1 of FIGS. 4 to 7 are 4-terminal devices, and deep depletion around the anode is generated by high gate bias and low doping epitaxy.

However, in the DPD modification 9 of FIGS. 1 to 3 the p+/n+ junction is forward biased, the depleted region around the gate coincides with the absorption region and is illuminated, and signal detection is based on the p+/n+ junction forward current flowing in the device 9 once the pinch-off condition is removed by the photocarriers generated in the absorption area.

Contrary to that, in the photodiode 1 of FIGS. 4 to 7 the p+/n+ junction is reverse biased, the depleted region around the gate is decoupled from the absorption region and is not illuminated thanks to the use of the metal shielding layer 6, and signal detection is based on the p+/substrate current flowing in the device 1 once the pinch-off condition is removed by the photocarriers generated in the absorption areas around the at least one cathode 42, 52.

In FIGS. 8 to 11 another exemplary embodiment of the photodiode 1 is illustrated. Compared to the embodiment of FIGS. 4 to 7, the photodiode 1 of FIGS. 8 to 11 further comprises a third electrode 43 preferably as a second cathode atop a third doped area 53. For the thickness and the doping of the third doped area 53, preferably the same applies as mentioned above for the second doped area 52.

Thus, the photodiode 1 of FIGS. 8 to 11 is a 5-terminal device, and in the detection mode preferably the following applies, in particular with a tolerance of not more than a factor of 2 or with a tolerance of not more than a factor of 1.5:

Voltage Va at the first electrode 31 as the anode: 1 V;
voltage Vc1 at the second electrode 42 as the cathode: >Va;
voltage Vc2 at the third electrode 43 as the second cathode: <Va;
voltage Vg at the gate electrode 34: >1.8 V;
voltage Vs, GND at the substrate 7: 0 V.

This means that the anode 31/first cathode 42 junction is reverse biased, the anode 31/second cathode 43 junction is forward biased and the gate bias introduces the deep depletion in the semiconductor body 2 region around the first doped area 51.

The photodiode 1 of FIGS. 8 to 11 works as follows:

The radiation R is absorbed only in the depleted region 22 around the first cathode 42, that is, at the n+/p– epi junction, while the preferably metallic shielding layer 6 hinders the direct absorption of photons in the pinched region around the p+ anode 31, 51 and in the n+ area 53 of the second cathode 43.

The photogenerated electrons E are collected at the n+ first cathode 42, 52 while the photogenerated holes P drift towards the negatively charged depleted region 22 around the p+ anode 31, 51. This photogenerated current of holes P balances the fixed negative charge in the depleted region 22 around the p+ anode area 51.

After reaching a threshold value as a trigger condition, depending on gate bias and substrate doping, the thickness of the depleted region 22 around the p+ anode region 51 will be continuously reduced due to the flow of holes P, until the pinch-off between contiguous depleted regions around the p+ anode region 51 will disappear. The current Im can thus flow between the anode 31, 51 and the second cathode 43, 53, representing a forward biased junction with the holes P flowing from the anode 31, 51 to the second cathode 43, 53 and electrons E from the second cathode 43, 53 to the anode 31, 51, as in a DPD.

As in the embodiment of the photodiode 1 of FIGS. 4 to 7, a relatively small hole current also flows between the anode 31, 51 and the substrate 7. The detection of photons is then marked by the steep onset of the forward current Im between the anode 31, 51 and the second cathode 43, 53 with a delay time depending on the photon flux intensity impinging on the first cathode 42, 52/p– semiconductor body 2 junction, see FIG. 11.

Hence, in this configuration the detection signal is amplified by the forward current flowing between the anode 31, 51 and the second cathode 43, 53, once the pinch-off region around the anode 51 is removed, due to the photons absorption at the first cathode 42, 52/p– semiconductor body 2 junction.

Contrary to the DPD modification of FIGS. 1 to 3, the photodiode 1 of FIGS. 8 to 11 is a 5-terminal device. There is one p–/n+ junction that is reverse biased and used for photon absorption, and there is one p–/n+ junction that is forward biased and used for amplified signal generation. The amplification region is decoupled from the absorption region and is not illuminated thanks to the use of the shielding layer 6. Signal detection is based on the p–/n+ forward current flowing in the device 1 once the pinch-off condition is removed by the photocarriers generated in the absorption area at the n+/p– reverse biased junction.

Thus, an increased absorption efficiency can be achieved because there is no longer any size limitation for the amplification region governed by the pinch-off effect. The increase in the absorption and collection efficiency leads to a general increase in quantum efficiency, to the minimization of dark current and thus to a better SNR in a wide range of experimental conditions. The absorption characteristics of the photodiode can be suitably tailored and/or modulated to enhance the collection efficiency in specific spectral ranges.

Figure 12:
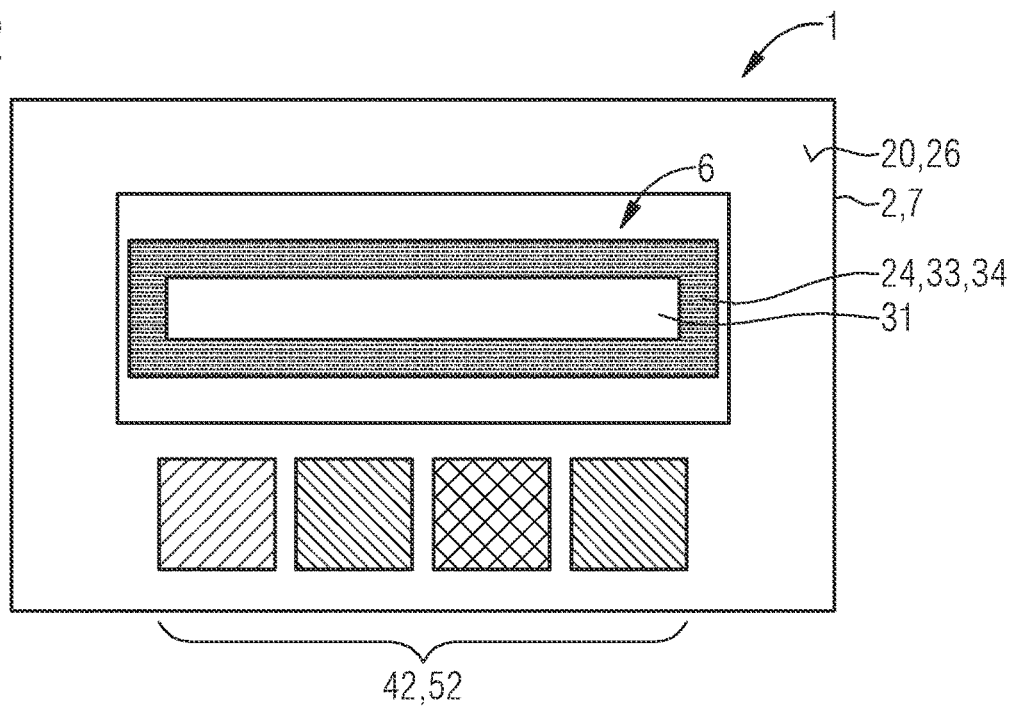
FIGS. 12 and 13 show top views of exemplary embodiments of photodiodes described herein.
Figure 13:
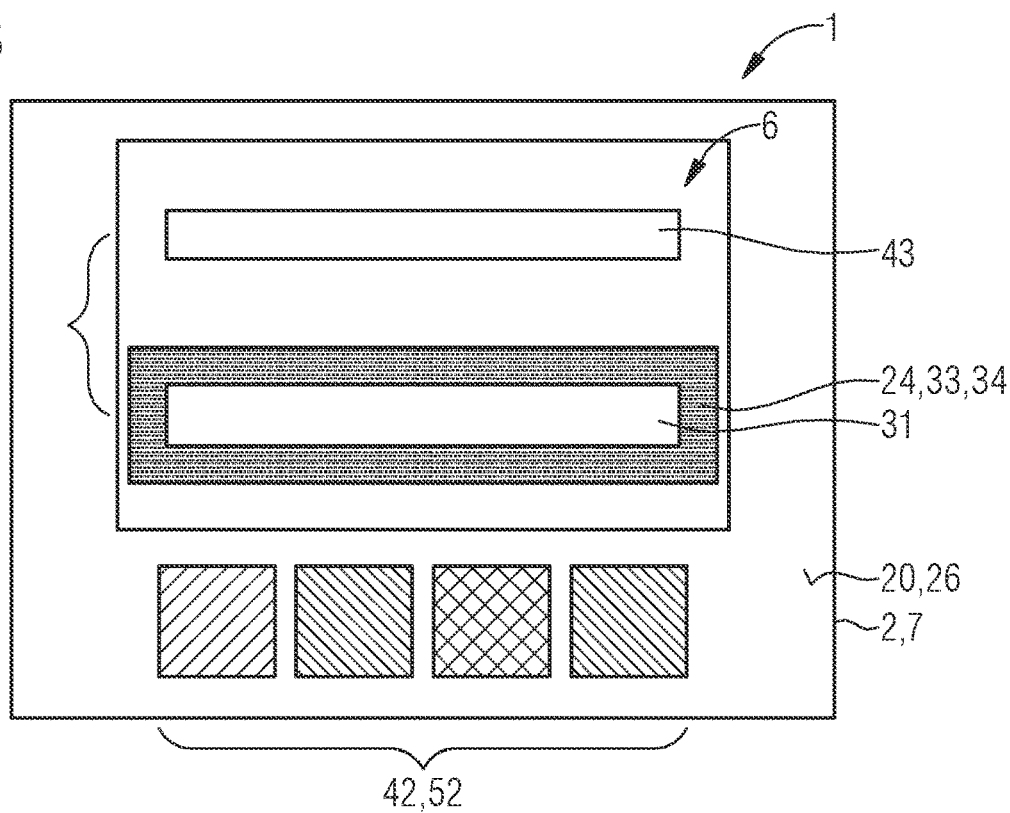

FIGS. 12 and 13 show top views of further exemplary embodiments. In the photodiodes 1 of FIGS. 4 to 11, there is only one second electrode 42. Contrary to that, in FIGS. 12 and 13 in each case there is a plurality of second electrodes 42.

According to FIGS. 12 and 13, the gate electrode 34 completely surrounds the first electrode 31, 51. Seen in a top view, the first electrode 31, 51 is shaped as a straight bar. Along said bar, the second electrodes 42, 52 are arranged. The second electrodes 42, 52 are electrically individually addressable. For example, there are four second electrodes 42, 52 for red, green and blue light and optionally for near infrared radiation.

This means that the second electrodes 42, 52 are four different photodiodes preferably with different spectral characteristics, obtained, for example, by using optical filters or different depletion layer characteristics. The second electrodes 42, 52 share the same amplification region, that is, the first doped area 51 surrounded by the gate structure 35, 24, 25.

Signals from the photodiodes associated with the second electrodes 42, 52 can be read sequentially by biasing the corresponding n+ area 52 of the reading photodiode at a positive bias higher than the anode bias and leaving, for example, floating the n+ regions of the remaining second electrodes 42, 52 photodiodes.

The signals produced by all the photodiodes and second electrodes 42, 52 can thus be read sequentially, with all the devices sharing the same amplification region. This is actually not possible with the DPD modification 9 illustrated in FIGS. 1 to 3 or with avalanche detectors.

Moreover, see FIG. 13, the third electrode 43 can also be present. The third electrode 43 can run in parallel with the first electrode 31 and is preferably distant from the first electrode 31. If the first electrode 31 has any curvature, contrary to what is shown in FIG. 13, then preferably the third electrode 43 has the same curvature and/or the same basic shape, seen in top view. A length of the third electrode 43 is preferably the same or approximately the same as a length of the first electrode 31. Approximately can mean with a tolerance of at most a factor of 1.5 or 1.2 or 1.1. In particular, there is a one-to-one arrangement between the third electrode 43 and the first electrode 31. Preferably, the third electrode 43 is completely surrounded by the radiation shield 6, seen in top view. Theses aspects of the third electrode 43 can apply cumulatively or individually to all exemplary embodiments of the photodiode 1 comprising at least one third electrode 43.

Figure 14:
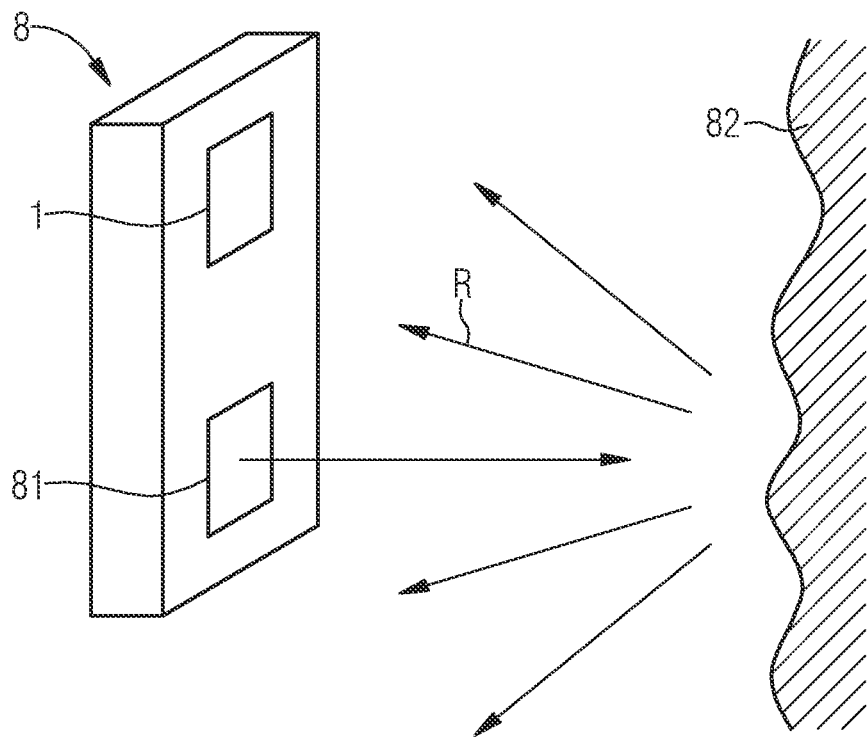
FIGS. 14 and 15 show exemplary embodiments of sensors comprising photodiodes described herein.
Figure 15:
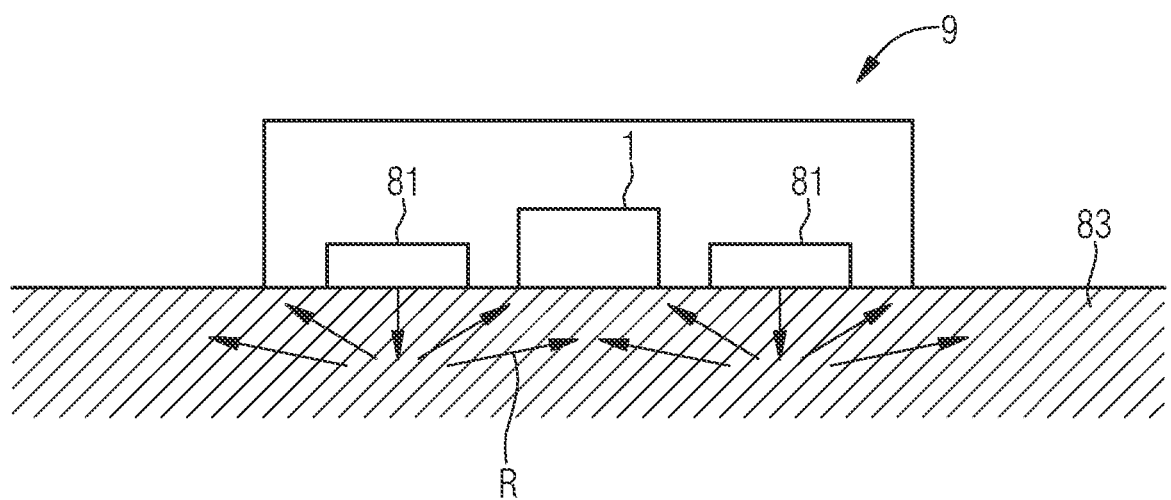

In FIGS. 14 and 15, sensors 8 using exemplary embodiments of photodetectors 1 are illustrated.

For example, the sensor 8 of FIG. 14 is a Time-of-Flight sensor, ToF sensor for short, used in particular for optical proximity measurements in a portable apparatus like a smartphone. Hence, a distance between the sensor 8 and an object 82 can be determined. For this purpose, the sensor 8 can include a radiation source 81. The radiation source 81 may be a laser emitting near infrared radiation.

Depending on the wavelength used in the radiation source 81, the material the photodiode 1 is based on may vary. This means that the photodiode 1 cannot only be based on silicon but also on other semiconductor materials like Ge, AlInGaAs or AlInGaP. The same applies to all other exemplary embodiments of the photodiode 1.

According to FIG. 15, the sensor 8 is a PhotoPlethysmography device, PPG device for short, for vital signs monitoring in wearable and hearable devices like smart watches or smart headphones. Therefore, the sensor 8 can include multiple radiation sources 81 for different wavelength ranges that may irradiate into skin 83.

In FIG. 16, a schematic electrification of the photodiode 1 is illustrated. In particular, this electrification is for a photodiode 1 according to the embodiment of FIG. 4. Thus, the photodiode 1 receives the radiation R as an optical input ii. The signal from the photodiode 1 is fed to a transimpedance amplifier 12, followed by an optional filter 13 and by a analog-to-digital converter 14. The analog-to-digital converter 14 is for signal amplification and digitization.

The components 1, 12, 13, 14 may be integrated in the sensor 8 or in a device that includes the photodiode 1 and/or the whole sensor 8, like a smartwatch or a smartphone. Otherwise, for example, the components 12 and/or 14 may be external components. The same applies to all other exemplary embodiments.

In FIG. 17, a further schematic electrification of the photodiode 1 is illustrated. In particular, this electrification is for a photodiode 1 according to the embodiment of FIG. 8. Thus, the photodiode 1 receives the radiation R as the optical input ii. The signal generated in the photodiode 1 is fed to a time-to digital converter 15. As an option, not shown, a filter as in FIG. 16 may also be present. The time-to digital converter 15 is for digitization a timing signal of the photodiode 1.

The components shown in the figures follow, unless indicated otherwise, preferably in the specified sequence directly one on top of the other. Components which are not in contact in the figures are preferably spaced apart from one another. If lines are drawn parallel to one another, the corresponding surfaces are preferably oriented parallel to one another, too. Likewise, unless indicated otherwise, the positions of the drawn components relative to one another are correctly reproduced in the figures.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. A photodiode comprising:
   a semiconductor body having a light entrance side and a back side opposite the light entrance side;
   a first electrode at the light entrance side atop a first doped area of a first conductivity type;
   a second electrode at the light entrance side atop a second doped area of a second conductivity type, the second doped area being configured to absorb radiation to be detected and thereby to generate charge carriers;
   a gate region at the light entrance side at least between the first electrode and the second electrode, the gate region being connected to a gate electrode;
   a base electrode at the semiconductor body, the base electrode being configured to receive a current flow from the first electrode, the current flow being indicative of a radiant flux of the radiation onto the second doped area; and
   a radiation shield covering and shielding the first doped area and the gate region from the radiation to be detected,
   wherein the photodiode is configured to, upon applying a reverse bias voltage between the first electrode and the second electrode and upon applying a gate voltage to the gate electrode, balance a depletion at the first doped area by generated charge carriers from the second doped area based on the current flow between the base electrode and the first electrode.

2. The photodiode according to claim 1, wherein the radiation shield completely covers the first doped area and the gate region, wherein the second doped area is distant from the radiation shield, seen in a top view onto the light entrance side, and wherein the radiation shield is electrically insulated at least from the first electrode, the second electrode and the gate electrode.

3. The photodiode according to claim 1, wherein the radiation shield is of at least one metal, and wherein the radiation shield is electrically insulated from the semiconductor body and is not electrically functionalized in the photodiode.

4. The photodiode according to claim 1, further comprising a substrate onto which the semiconductor body is grown, wherein the substrate is of the first conductivity type, and wherein the semiconductor body as a whole is weakly doped and is also of the first conductivity type.

5. The photodiode according to claim 1, wherein the base electrode is located at the back side of the semiconductor body.

6. The photodiode according to claim 1, wherein the base electrode is located at the light entrance side of the semiconductor body.

7. The photodiode according to claim 1, wherein the gate region completely surrounds the first electrode, seen in a top view onto the light entrance side.

8. The photodiode according to claim 1, further comprising a third electrode atop a third doped area of the second conductivity type, wherein the first electrode is located between the second electrode and the third electrode, and wherein a junction between the first electrode and the third electrode is configured to be forward biased.

9. The photodiode according to claim 8, wherein the third electrode is configured for signal amplification of the current flow between the base electrode and the first electrode, and wherein the third electrode as well as an entire area between the third electrode and the first electrode are completely covered by the radiation shield.

10. The photodiode according to claim 1, further comprising a plurality of the second electrodes and of associated second doped areas, wherein the second electrodes and the associated second doped areas are sensitive for different spectral regions of the radiation to be detected.

11. The photodiode according to claim 10, wherein the second electrodes are individually addressable, and wherein a number of the second electrodes is between 2 and 16, inclusive, and all the second electrodes are assigned to the same first electrode.

12. The photodiode according to claim 10, wherein the first electrode is a line segment and the second electrodes are arranged along this line segment when seen in a top view onto the light entrance side.

13. A method for operating a photodiode, wherein the photodiode comprises a semiconductor body having a light entrance side and a back side opposite the light entrance side, a first electrode at the light entrance side atop a first doped area of a first conductivity type, a second electrode at the light entrance side atop a second doped area of a second conductivity type, the second doped area for absorbing radiation to be detected and thereby to generate charge carriers, a gate region at the light entrance side at least between the first electrode and the second electrode, the gate region being connected to a gate electrode, a base electrode at the semiconductor body, the base electrode for receiving a current flow from the first electrode, the current flow being indicative of a radiant flux of the radiation onto the second doped area and a radiation shield covering and shielding the first doped area and the gate region from the radiation to be detected, the method comprising:
applying a reverse bias voltage between the first electrode and the second electrode,
applying a gate voltage to the gate electrode;
balancing a depletion at the first doped area by generated charge carriers from the second doped area; and
enabling the balancing of the depletion by the current flow between the base electrode and the first electrode.

14. The method according to claim 13, further comprising using the photodiode without a third electrode, wherein the current flow is used as it is as a measurement signal for the radiant flux.

15. The method according to claim 13, further comprising:
amplifying the current flow by a third electrode,
wherein a measurement signal for the radiant flux is a time delay between a reset of the photodiode and a beginning of the amplified current flow.

16. The method according to claim 13, further comprising:
receiving, by the photodiode, an optical input;
converting, by the photodiode, the optical input into an electrical signal;
feeding the electrical signal to a transimpedance amplifier, then to a filter and then to an analog-to-digital converter; and
outputting, by the analog-to-digital converter, a digitalized signal representative of the optical input.

17. The method according to claim 13, further comprising:
receiving, by the photodiode, an optical input;
converting, by the photodiode, the optical input into an electrical signal;
feeding the electrical signal to a time-to-digital converter; and
outputting, by the time-to-digital converter, a digitalized signal representative for the optical input.

18. A photodiode comprising:
a semiconductor body having a light entrance side and a back side opposite the light entrance side;
a first electrode at the light entrance side atop a first doped area of a first conductivity type;
a second electrode at the light entrance side atop a second doped area of a second conductivity type, the second doped area being configured to absorb radiation to be detected and thereby to generate charge carriers;
a third electrode atop a third doped area of the second conductivity type;
a gate region at the light entrance side at least between the first electrode and the second electrode, the gate region being connected to a gate electrode,
a base electrode at the semiconductor body, the base electrode being configured to receive a current flow from the first electrode, the current flow being indicative of a radiant flux of the radiation onto the second doped area; and
a radiation shield covering and shielding the first doped area from the radiation to be detected,
wherein the radiation shield completely covers the first doped area as well as the gate region,
wherein the second doped area is distant from the radiation shield, seen in a top view onto the light entrance side,
wherein the first electrode is located between the second electrode, and
wherein the third electrode and a junction between the first electrode and the third electrode to be forward biased.

* * * * *